United States Patent [19]

Hughes

[11] Patent Number: 4,849,690

[45] Date of Patent: Jul. 18, 1989

[54] DETECTION OF TRANSPOSITION GROUP SHORT CIRCUITS IN MACHINE WINDINGS

[75] Inventor: Kevin B. Hughes, Winter Park, Fla.

[73] Assignee: Westinghouse Electric Corp., Pittsburgh, Pa.

[21] Appl. No.: 114,464

[22] Filed: Oct. 30, 1987

[51] Int. Cl.$^4$ ............................................. G01R 31/02
[52] U.S. Cl. ............................. 324/158 MG; 324/110; 324/528; 322/99; 318/490; 361/20
[58] Field of Search ....... 324/158 R, 158 MG, 158 P, 324/72.5, 102, 510, 529, 530, 545, 546, 547, 110; 361/20, 23, 24, 29, 30, 31, 45, 91; 340/648, 650, 651; 318/490; 322/99

[56] References Cited

U.S. PATENT DOCUMENTS

| | | | |
|---|---|---|---|
| 3,506,914 | 4/1970 | Albright et al. | 324/546 |
| 3,539,923 | 11/1970 | Tsergas | 324/546 X |
| 3,562,902 | 2/1971 | Green | 324/546 X |
| 4,115,731 | 9/1978 | Antell, III | 324/528 |
| 4,150,411 | 4/1979 | Howell | 361/45 |
| 4,164,705 | 8/1979 | Whitney et al. | 324/546 X |
| 4,370,609 | 1/1983 | Wilson et al. | 324/522 |
| 4,445,085 | 4/1984 | Metcalf et al. | 324/529 |
| 4,475,078 | 10/1984 | Itani | 324/529 |
| 4,542,333 | 9/1985 | Koontz | 324/529 |
| 4,742,422 | 5/1988 | Tigges | 361/91 X |

Primary Examiner—Reinhard J. Eisenzopf
Assistant Examiner—Warren S. Edmonds
Attorney, Agent, or Firm—D. C. Abeles

[57] ABSTRACT

A method for nondestructively electronically detecting a short circuit in a conductor system which is composed of two parallel inductor groups connected together to form a selected current path when no short circuit exists, by the steps of: disposing a current probe at a selected location of the current path for sensing changes in the current flowing in the path at the selected location; and injecting a fast rate-of-rise current pulse into the path; and monitoring the response of the current probe to provide an indication of the existence of a short circuit.

10 Claims, 1 Drawing Sheet

DETECTION OF TRANSPOSITION GROUP SHORT CIRCUITS IN MACHINE WINDINGS

BACKGROUND OF THE INVENTION

The present invention relates to the testing of windings for the purpose of detecting short circuits between adjacent transposition groups within the stator coils of a large gas-cooled machine, particularly a synchronous generator.

If a short circuit should develop between the transposition groups of such a machine, it must, of course, be located before a repair can be attempted. Heretofore, this has been done by disconnecting the phase leads to permit testing of insulation. Such a procedure, particularly since it involves unbrazing and then re-brazing the phase leads, is costly and time consuming.

SUMMARY OF THE INVENTION

It is an object of the present invention to simplify the detection and localization of short circuits in such machines.

Another object of the invention is to permit such testing to be performed without requiring any disconnection of the phase leads.

The above and other objects are achieved, according to the present invention, by a method for nondestructively electronically detecting a short circuit in a conductor system which is composed of two inductor groups connected together to form a selected current path when no short circuit exists, comprising:

disposing a least one current probe at a selected location of the current path for sensing changes in the current flowing in the path at the selected location; and injecting a fast rate-of-rise current pulse into the path; and monitoring the response of the current probe to provide an indication of the existence of a short circuit.

The method according to the invention can be applied to any gas cooled machine and was developed particularly for the testing of gas cooled four-pole synchronous generators.

DESCRIPTION OF THE PREFERRED EMBODIMENTS

Figure 1:
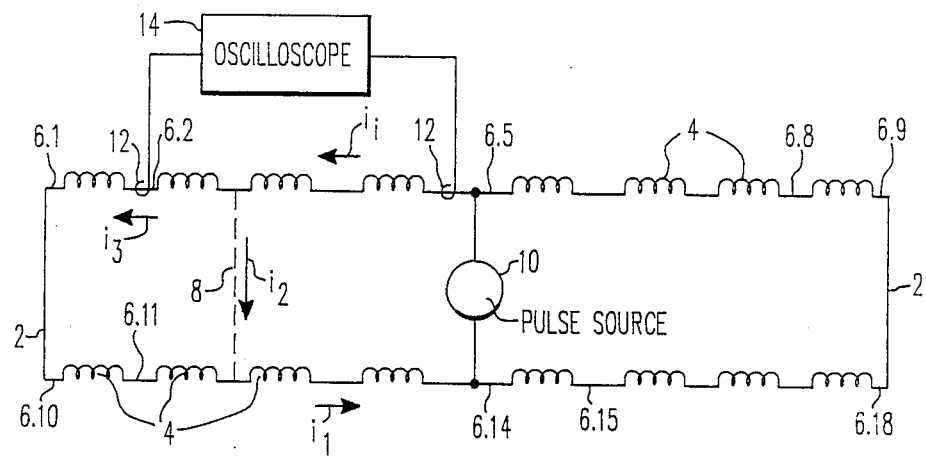
FIG. 1 is a circuit diagram illustrating short circuit testing of a pair of coil groups according to the invention.

FIG. 1 shows a pair of transposition groups within a stator coil group constituting, for example, part of a four-pole stator of a large, gas-cooled, a.c. synchronous generator. Each stator coil group may contain many transposition groups and any two groups may be treated as a pair. All transposition groups of a stator coil group are brazed together at ends, or phase leads, 2.

In the illustrated embodiment, a transposition group pair is shown over a length of eight half-coils 4.

Adjacent half-coils 4 are connected together via coil leads at externally accessible terminals, or series connection points, 6.$n$, where n = 1 ... 18. The generator rotor winding is supplied with excitation current by an exciter and the generator is disposed physically between the exciter and a turbine. Each half-coil 4 extends between the exciter end and the turbine of the generator.

In such coil systems, it is necessary to determine the existence of, and locate, short circuits between transposition groups, one exemplary short circuit being shown by broken line 8. This is achieved, according to the invention, by applying current pulses having a fast rate of rise between the two transposition groups, monitoring the resulting current in the coils at selected points along a path of current flow, and shifting the monitoring location to localize any short circuit existing between the pair of transposition groups.

Thus, as shown in FIG. 1, a current pulse source 10 is connected between terminals 6.5 and 6.14, each of which is at the midpoint of its associated transposition group. This midpoint is physically located at the appropriate series connection in the coil group. Source 10 can be connected between any other pair of terminals 6, but each terminal 6 should be within a different transposition group.

One or several current probes 12 are then arranged to monitor the current flowing at selected terminals 6. Each probe 12 is constituted by a sensing coil bent in the form of an open loop, i.e. a loop which is open at the free end of the coil, so that it can simply be placed around a coil lead and can then produce an output signal proportional to the rate-of-rise, or the time derivative, of the current pulse waveform. Probes 12 are connected to a dual input oscilloscope 14 where the probe output signals are displayed.

When steeply rising current pulses are applied between two terminals 6, the waveform of the resulting current flowing through each other terminal will depend on whether a short circuit exists between that terminal and source 10.

For example, if short circuit 8 is present, and a current pulse is produced by source 10, a current $i_1$ will flow through terminals 6.4 and 6.13, while a current $i_2$ will flow through short circuit 8 and a current $i_3$ will flow through the coils located beyond short circuit 8, where:

$$i_1 = i_2 + i_3,$$

and $i_2$ will normally be much greater than $i_3$. As a result, each pulse from source 10 will cause the probe 12 adjacent terminal 6.5 to produce the output signal 20 of FIG. 2 and will cause the probe 12 at terminal 6.2 to produce the output signal 22 of FIG. 2.

The substantial difference between the waveforms, or peak, or average, values of these two signals can be detected in various ways to provide an indication of the existence of a short circuit. Such detection can be achieved by visual observation of oscilloscope 14 or by electronic comparison of the outputs of probes 12 subsequent to each pulse from source 10.

Each probe 12 may be of a type which can easily be placed around a conductor and which can respond to steeply rising current pulses. One suitable type is a flexible current probe marketed by T&M Research, Inc., of Alberquerque, NM. Such a probe can be connected to the oscilloscope by a 50Ω coaxial cable. Oscilloscope 14 could be a Nicolet Model 2090.

For monitoring a transposition group pair, probes 12 can first be placed at terminals 6.5 and 6.1 or 6.10. If the two probes produce comparable output signals, it can be concluded that no short circuit between the transposition groups exists to the left of terminals 6.5 and 6.14.

Then probes 12 can be placed at terminals 6.5 and 6.9 or 6.18. Again, if comparable output signals are produced, no short circuit exists to the right of terminals 6.5 and 6.14.

On the other hand, if the output signals from probes 12 differ significantly from one another in a manner which indicates that a short circuit exists, then either probe can be moved from terminal to terminal to locate the short. For example, in the case of the probe locations and short circuit 8 shown in FIG. 1, probe 12 at terminal 6.5 will produce an output signal 20 and probe 12 at terminal 6.2 will produce an output signal 22.

If the left-hand probe 12 is then moved to the right from terminal to terminal, it will continue to receive current $i_3$, and to produce output signal 22 in response to each pulse from source 10 until being placed at terminal 6.4, where it will receive current $i_1$ and produce output signal 20. This will indicate that the short circuit is located in the vicinity of terminal 6.3.

The method according to the invention can be applied to any pair of winding transposition groups for which the current path, in the absence of a short circuit, is known. This current path is easily determined from the stator coil design. The terminals of source 10 can be connected to any two spaced, externally accessible series connection points of a transposition group pair having at least one coil between the connection points. However, it is preferred that each connection point be constituted by the series connection of a respective one of the groups constituting the pair, and most preferably each connection point should be at the midpoint of the series arrangement of stator coils for constituting the respective transposition group.

Preferably, each probe 12 is connected to a respective input of oscilloscope 14 via a filter. The resulting current probe signals can then permit an accurate distinction between a properly insulated transposition group pair and a shorted pair.

By way of example, the current pulses produced by source 10 can have a rate-of-rise of 5 to 50 A/$\mu$s and a duration of the order of 1–50 $\mu$s, permitting a short in a transposition group pair to be stressed with a voltage of between about 20 volts and 200 volts. The pulses produced by source 10 should have a triangular current waveform and a rectangular voltage waveform. These pulses produce readily discernable current probe responses.

Figure 2:
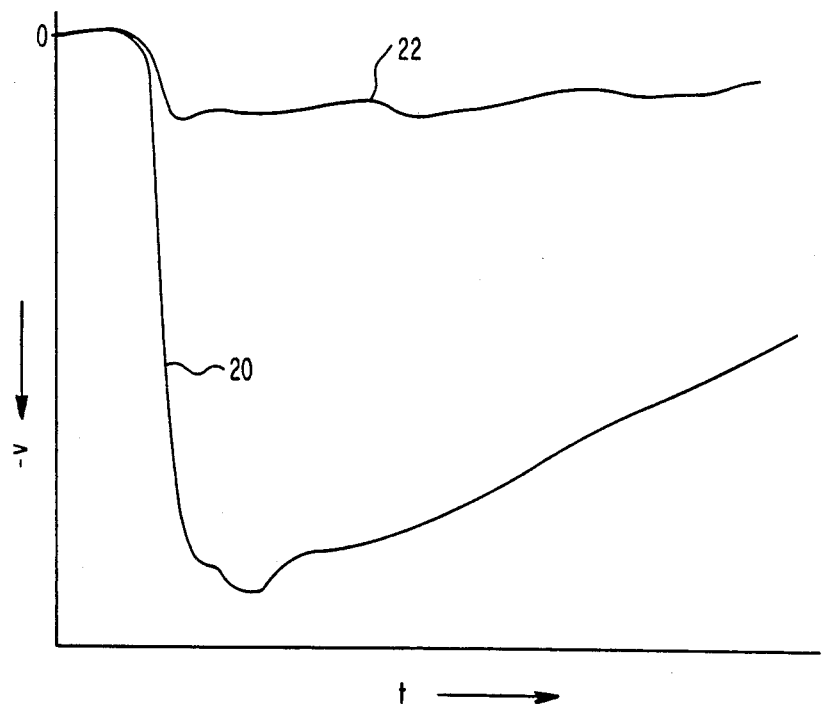
FIG. 2 is a diagram illustrating the waveforms of test signals produced by the practice of the method according to the invention.

The pulse polarity shown in FIG. 2 has been selected purely arbitrarily and could alternatively be positive.

It will be understood that the above description of the present invention is susceptible to various modifications, changes, and adaptations, and the same are intended to be comprehended within the meaning and range of equivalents of the appended claims.

What is claimed is:

1. A method for nondestructively electronically detecting a short circuit in a conductor system which is composed of two groups of inductors connected together to form a selected current path when no short circuit exists, comprising:
   disposing a current probe at a selected location of the current path for sensing changes in the current flowing in the path at the selected location;
   injecting a fast rate-of-rise current pulse between two points of the path, with each point being separated from the selected location by at least one inductor; and
   monitoring the amplitude of current change sensed by the current probe to provide an indication of the existence of a short circuit.

2. A method as defined in claim 1 further comprising disposing a second current probe at a second location of the path, spaced from the selected location, and said step of monitoring comprises comparing the responses of the two probes.

3. A method as defined in claim 2 wherein each inductor comprises a coil and each group comprises a plurality of coils connected together in series; and said step of disposing comprises disposing each current probe between two of the coils of the two conductor groups.

4. A method as defined in claim 2 further comprising, when the existence of a short circuit is indicated, changing the location of at least one of the current probes and repeating said steps of injecting and monitoring until the location of the short circuit is determined.

5. A method as defined in claim 1 wherein each inductor group is composed of a plurality of individual coils having coils leads connected together in series at externally accessible connection points, and said step of disposing comprises placing the probe around a selected coil lead without disconnecting that lead.

6. A method as defined in claim 1 wherein said step of injecting is performed by means of a current pulse source having two output terminals each conductively connected to a portion of the current path defined by a respective one of the two inductor groups.

7. A method as defined in claim 1 wherein the current pulse has a rate-of-rise of the order of 5–50 A/$\mu$s.

8. A method as defined in claim 7 wherein the current pulse has a duration of 1–50 $\mu$s.

9. A method as defined in claim 1 wherein the current pulse has a duration of 1–50 $\mu$s.

10. A method as defined in claim 1 wherein the inductor groups are stator coil transposition groups of a gas cooled electric machine.

* * * * *